United States Patent
Hsu et al.

(10) Patent No.: US 11,246,235 B2
(45) Date of Patent: Feb. 8, 2022

(54) WATERPROOF STRUCTURE

(71) Applicants: LITE-ON ELECTRONICS (GUANGZHOU) LIMITED, Guangzhou (CN); LITE-ON TECHNOLOGY CORPORATION, Taipei (TW)

(72) Inventors: Hung-Wen Hsu, Taipei (TW); Che-Cheng Chang, Taipei (TW); Jian-Lun Chen, Taipei (TW)

(73) Assignees: LITE-ON ELECTRONICS (GUANGZHOU) LIMITED; LITE-ON TECHNOLOGY CORPORATION

( * ) Notice: Subject to any disclaimer, the term of this patent is extended or adjusted under 35 U.S.C. 154(b) by 0 days.

(21) Appl. No.: 17/092,007

(22) Filed: Nov. 6, 2020

(65) Prior Publication Data

US 2021/0212230 A1    Jul. 8, 2021

Related U.S. Application Data

(60) Provisional application No. 62/956,360, filed on Jan. 2, 2020.

(51) Int. Cl.
| | |
|---|---|
| *H05K 5/06* | (2006.01) |
| *G01R 29/10* | (2006.01) |
| *H04B 17/11* | (2015.01) |
| *H04B 17/23* | (2015.01) |
| *H04B 17/27* | (2015.01) |
| *H01Q 3/00* | (2006.01) |
| *H01Q 3/08* | (2006.01) |
| *H01Q 1/12* | (2006.01) |

(52) U.S. Cl.
CPC .......... *H05K 5/069* (2013.01); *G01R 29/105* (2013.01); *H01Q 1/1207* (2013.01); *H01Q 3/005* (2013.01); *H01Q 3/08* (2013.01); *H04B 17/11* (2015.01); *H04B 17/23* (2015.01); *H04B 17/27* (2015.01)

(58) Field of Classification Search
CPC ...................................... H05K 5/069
See application file for complete search history.

(56) References Cited

U.S. PATENT DOCUMENTS

| | | | | |
|---|---|---|---|---|
| 6,116,615 | A * | 9/2000 | Trehan | H05K 9/0015 |
| | | | | 174/358 |
| 2020/0236799 | A1 * | 7/2020 | Roth | H04B 1/3888 |

* cited by examiner

*Primary Examiner* — Hung V Ngo
(74) *Attorney, Agent, or Firm* — Innovation Counsel LLP

(57) ABSTRACT

A waterproof structure includes a housing and a waterproof button. The housing has a first surface, a first side surface, and a second surface. The first side surface is recessed in the first surface to define a first opening, the first side surface is connected between the first surface and the second surface, and the second surface is exposed from the first opening. The waterproof button is disposed in the first opening and includes at least one first water blocking structure, and the first water blocking structure is pressed and deformed to abut against the first side surface.

15 Claims, 4 Drawing Sheets

WATERPROOF STRUCTURE

This application claims the benefit of U.S. provisional application Ser. No. 62/956,360, filed Jan. 2, 2020, the subject matter of which is incorporated herein by reference.

BACKGROUND OF THE INVENTION

Field of the Invention

The invention relates in general to a waterproof structure for an electronic device.

Description of the Related Art

The antenna monitoring device is an antenna alignment monitoring tool that can help users easily and quickly measure changes in antenna direction parameters. With its compact size, rugged design, user-friendly installation and unique reporting functions, the antenna monitoring device and antenna calibration device can be used together to help RF planning engineers enhance the radio coverage, thereby reducing cell interference and following the plan to maintain antenna performance.

However, electronic devices such as antenna monitoring devices are easily subjected to the influence of weather such as moisture and humidity. Therefore, how to improve the waterproof performance of antenna monitoring devices is an urgent issue to be solved in the industry.

SUMMARY OF THE INVENTION

The present invention is directed to a waterproof structure to improve the waterproof performance of an electronic device.

According to one aspect of the present invention, a waterproof structure including a housing and a waterproof button is provided. The housing has a first surface, a first side surface, and a second surface. The first side surface is recessed in the first surface to define a first opening, the first side surface is connected between the first surface and the second surface, and the second surface is exposed from the first opening. The waterproof button is disposed in the first opening and includes at least one first water blocking structure, and the first water blocking structure is pressed and deformed to abut against the first side surface.

Other objects, features, and advantages of the invention will become apparent from the following detailed description of the preferred but non-limiting embodiments. The following description is made with reference to the accompanying drawings.

Figure 1:
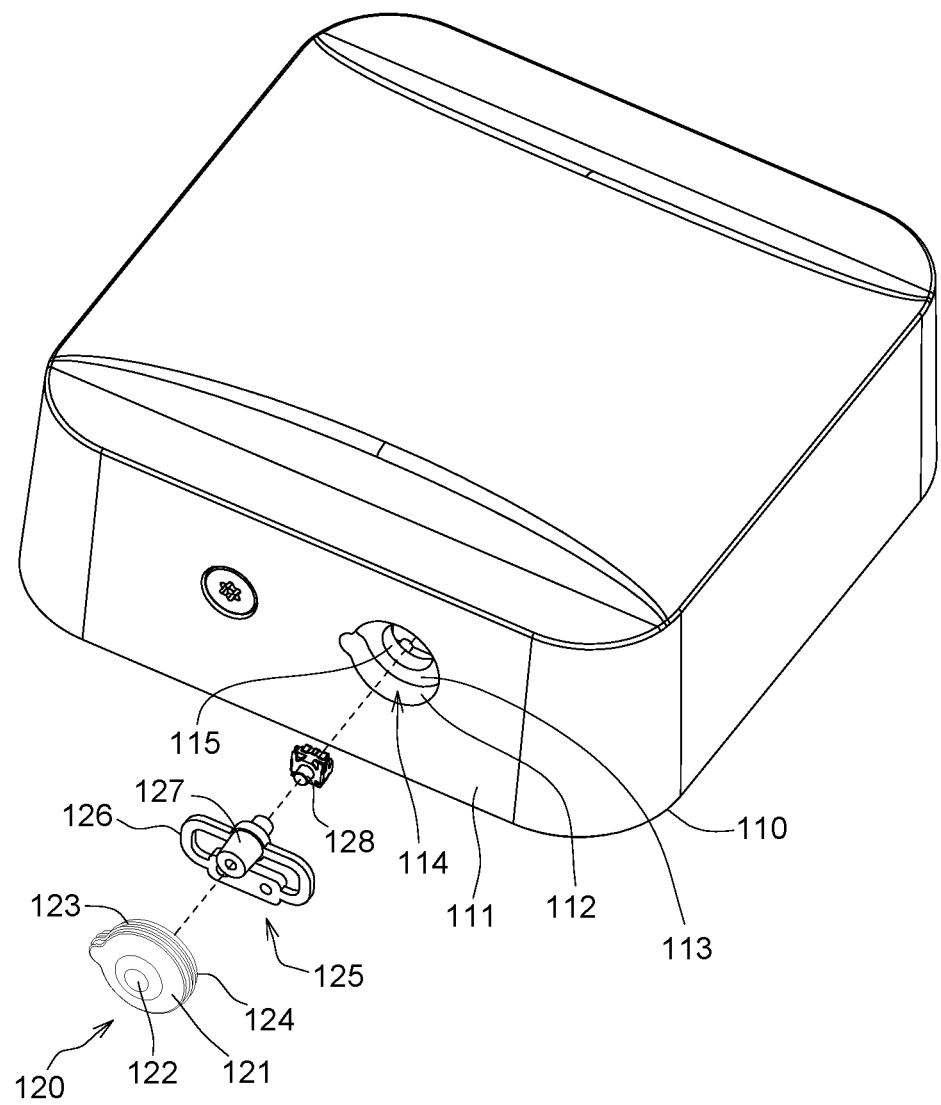
FIG. 1 is an exploded schematic diagram of a waterproof structure according to an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF THE INVENTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

First Embodiment

Figures 2, 2A:
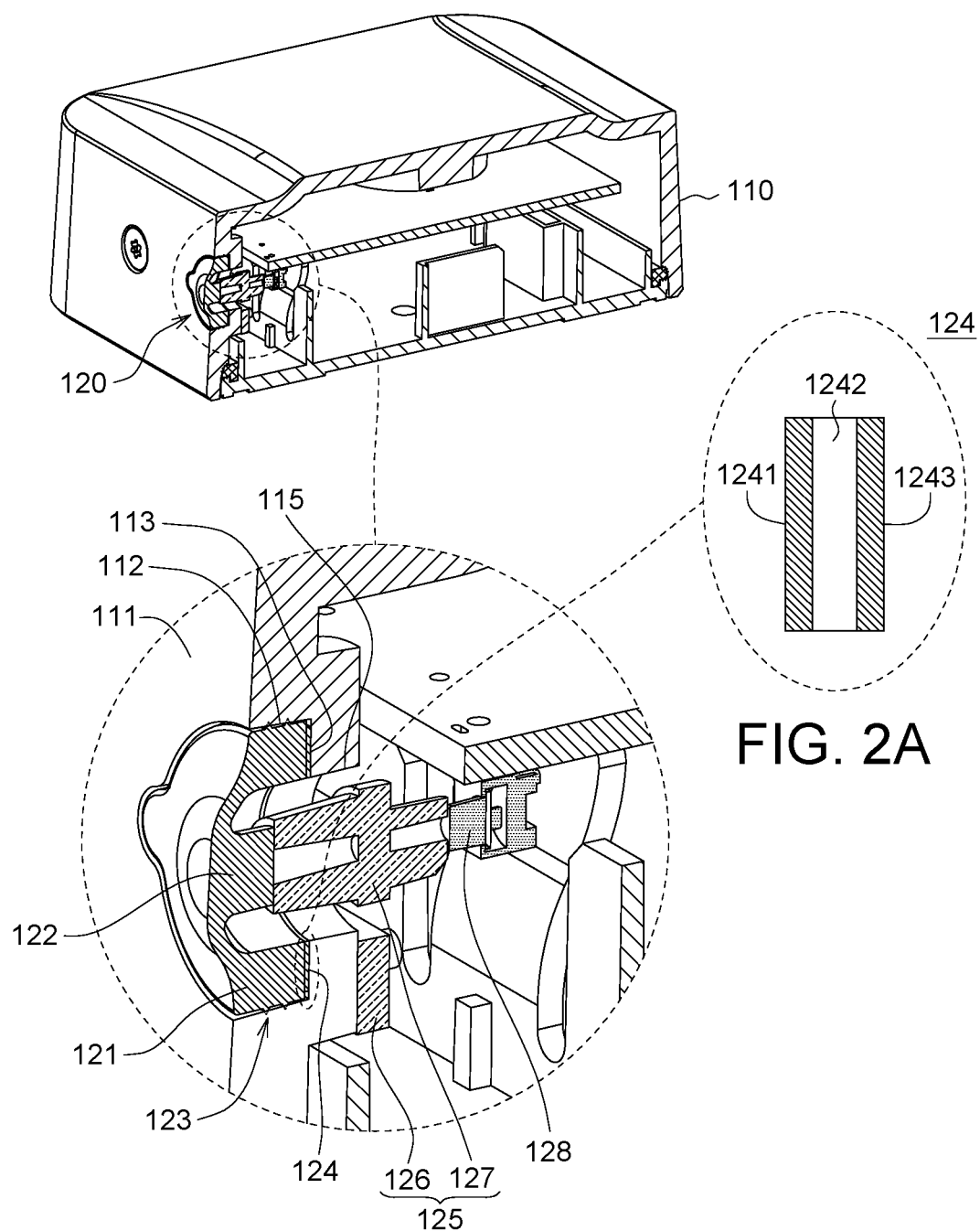
FIG. 2 respectively shows a cross-sectional view and a partial enlarged schematic view of a waterproof structure according to an embodiment of the present invention.
FIG. 2A is a schematic diagram of a water blocking structure.

Please refer to FIGS. 1 and 2. FIG. 1 is an exploded schematic view of a waterproof structure 100 according to an embodiment of the present invention, and FIG. 2 respectively shows a cross-sectional view and a partial enlarged schematic view of the waterproof structure 100 according to an embodiment of the present invention.

According to an embodiment of the present invention, the waterproof structure 100 is used in an electronic device, for example, an electronic device installed outdoors, especially an electronic device with waterproof requirements. As shown in FIG. 1, the waterproof structure 100 includes a housing 110 and a waterproof button 120. The housing 110 has a first surface 111, a first side surface 112, and a second surface 113. The first side surface 112 is recessed in the first surface 111 to define a first opening 114, and the first side surface 112 is connected between the first surface 111 and the second surface 113, and the second surface 113 is exposed in the first opening 114.

The first surface 111, the first side surface 112, and the second surface 113 may form a half-open groove for the waterproof button 120 to be accommodated in the housing 110. In addition, the second surface 113 may further have a second opening 115, the size (for example, diameter) of the second opening 115 is smaller than the size (for example, diameter) of the first opening 114, and a switch 128 inside the housing 110 may be exposed from the second opening 115 to be pressed by the waterproof button 120 to generate a pressing signal.

Referring to FIGS. 1 and 2, the waterproof button 120 is disposed in the first opening 114. The waterproof button 120 may include an annular portion 121, a pressing portion 122, at least one first water blocking structure 123, a second water blocking structure 124 and a hard bridge 125. The pressing portion 122 is located at the center of the annular portion 121, and the hard bridge 125 is disposed under the pressing portion 122 to support the pressing portion 122. When the user presses down the pressing portion 122, the hard bridge 125 can be moved into the housing 110 to touch the switch 128. The material of the annular portion 121 and the pressing portion 122 is, for example, rubber or other soft materials, and the material of the hard bridge 125 is, for example, plastic or other hard materials.

Referring to FIGS. 1 and 2, the hard bridge 125 is fixed to the inner side wall of the housing 110 by, for example, a hot melt manner, and the hard bridge 125 has a cantilever 126 and a movable protrusion 127 on the cantilever 126. When the user presses down the pressing portion 122, the protrusion 127 moves into the housing 110 to touch the switch 128 so as to increase the pressing feel. When the user releases the pressing portion 122, the protrusion 127 can return to the release position by the elasticity of the cantilever 126.

In an embodiment, the annular portion 121 and the pressing portion 122 are made of soft materials, which have high deformation and easy pressing performance, and can reduce the tolerance between the waterproof button 120 and the first side surface 112 of the housing 110 to improve waterproof performance. In addition, the first water blocking structure 123 is, for example, disposed around the outer periphery of the annular portion 121, and the first water blocking structure 123 can be pressed and deformed to block between the waterproof button 120 and the housing 110.

Referring to FIG. 2, the first water blocking structure 123 is, for example, an annular rib, which can be deformed by pressure to abut against the first side surface 112 of the housing 110. The rib is formed as, for example, conical, pyramidal, zigzag, wavy or other shapes. The material of the first water blocking structure 123 is, for example, rubber or other soft materials, which can prevent moisture from flowing into the housing 110 through the gap between the waterproof button 120 and the first side surface 112 of the housing 110, thereby improving the waterproof performance.

In addition, the second water blocking structure 124 is formed between the annular portion 121 and the second surface 113, for example. The second water blocking structure 124 is, for example, a waterproof adhesive or double-sided adhesive tape, which is adhered to the second surface 113 of the housing 110 to prevent moisture from flowing into the housing 110 through the gap between the waterproof button 120 and the second surface 113 of the housing 110, thereby improving the waterproof performance.

Referring to FIG. 2A, in an embodiment, the second water blocking structure 124 may include a first adhesive layer 1241, a flexible substrate 1242, and a second adhesive layer 1243, which can block moisture. The first adhesive layer 1241 is adhered to the lower surface of the annular portion 121, the second adhesive layer 1243 is adhered to the second surface 113 of the housing 110, and the flexible substrate 1242 is located between the first adhesive layer 1241 and the second adhesive layer 1243. The flexible substrate 1242 is, for example, a foam material such as polymer foam.

The waterproof button 120 is not limited to be implemented in the manner shown in FIG. 1 and FIG. 2. The first water blocking structure 123 and the second water blocking structure 124 can be implemented separately or in combination, and the present invention is not limited thereto. Furthermore, the first water blocking structure 123 is not limited to be disposed on the outer periphery of the annular portion 121, and the second water blocking structure 124 is not limited to be disposed between the lower surface of the annular portion 121 and the second surface 113. The embodiments can be adjusted according to the appearance of the waterproof button 120.

Second Embodiment

Figure 3:
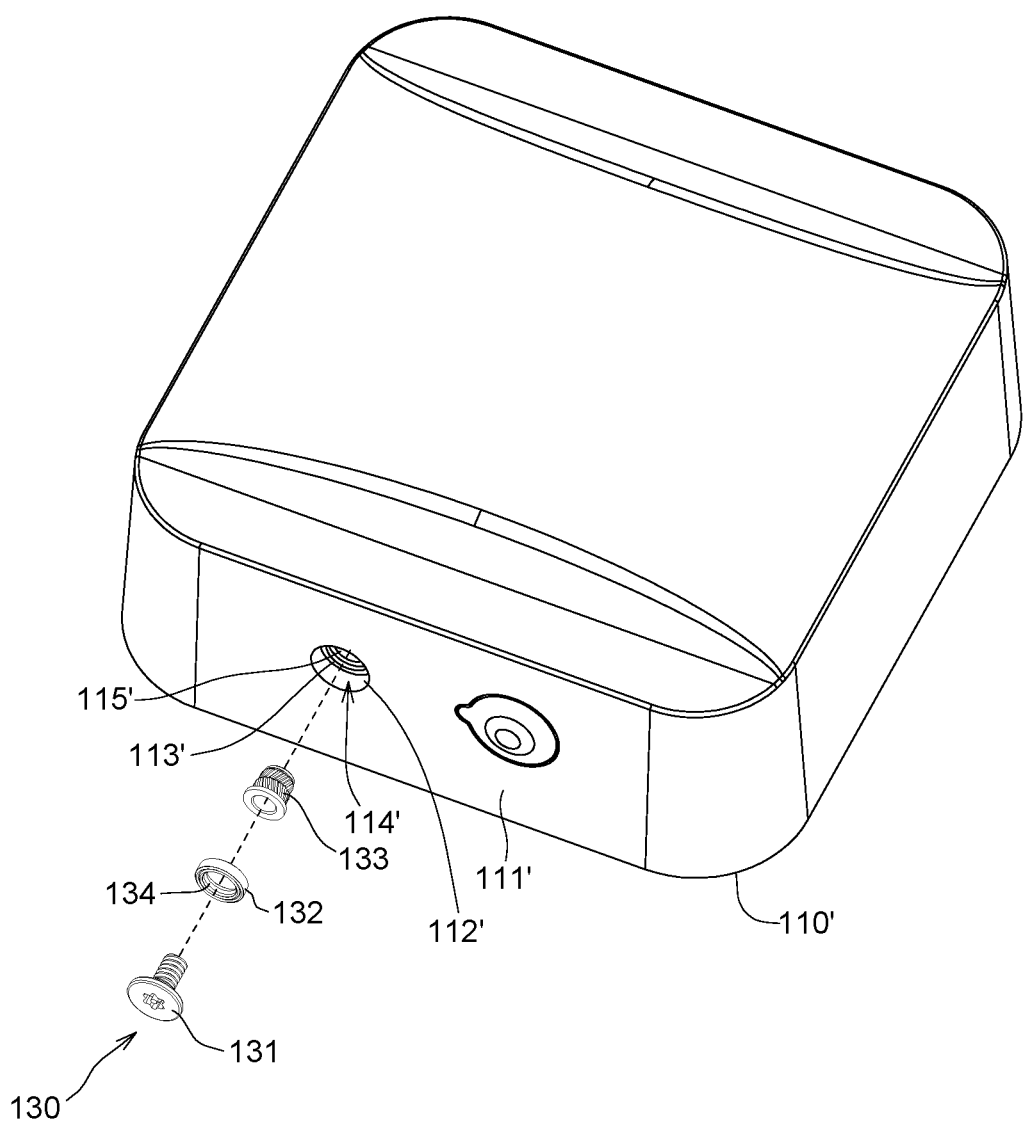
FIG. 3 is an exploded schematic view of a waterproof structure according to another embodiment of the present invention.
Figure 4:
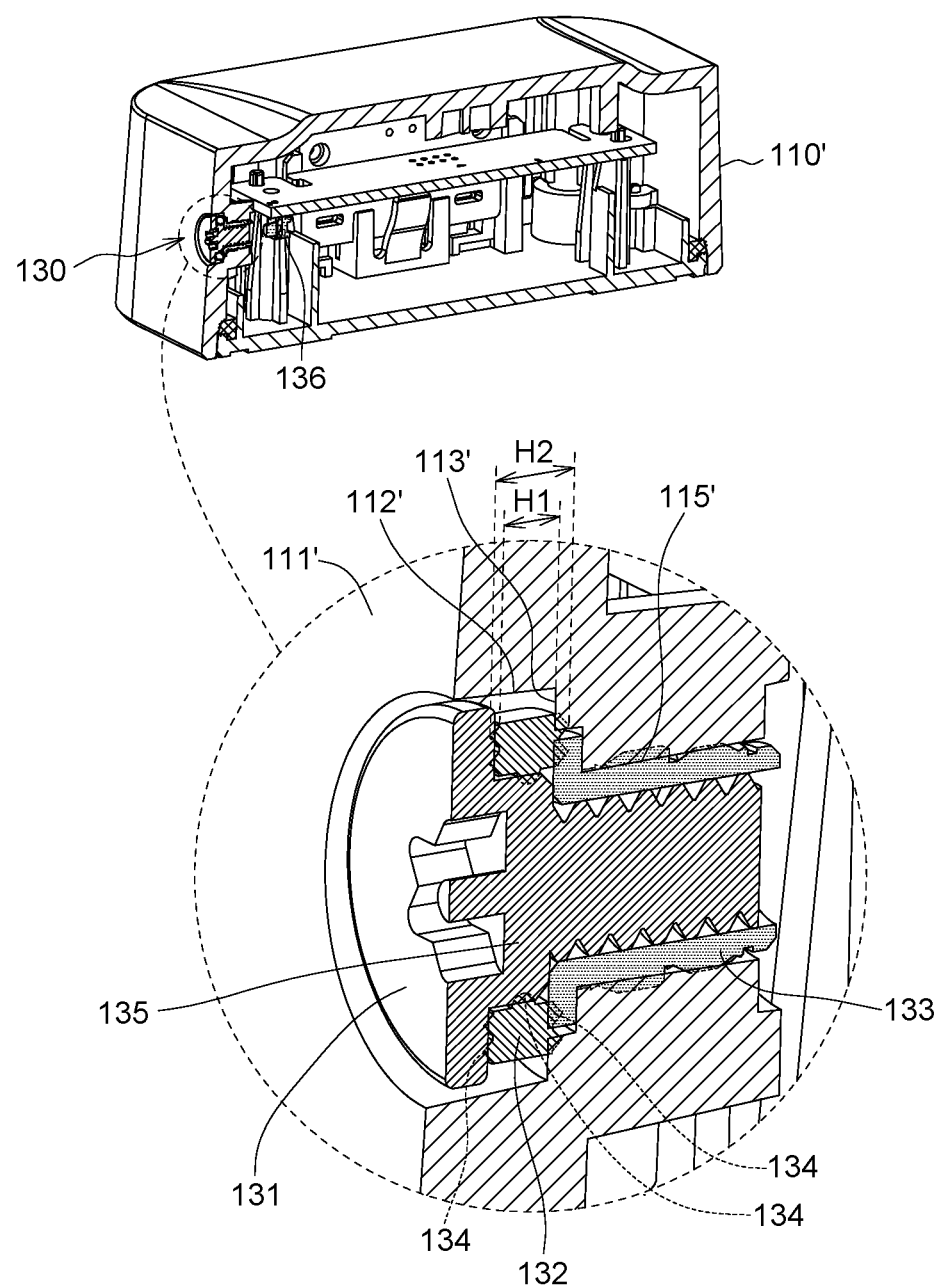
FIG. 4 respectively shows a cross-sectional view and a partial enlarged schematic view of a waterproof structure according to another embodiment of the present invention.

Refer to FIGS. 3 and 4. FIG. 3 is an exploded schematic view of a waterproof structure 101 according to another embodiment of the present invention, and FIG. 4 respectively shows a cross-sectional view and a partial enlarged schematic view of the waterproof structure 101 according to another embodiment of the present invention.

According to an embodiment of the present invention, the waterproof structure 101 includes a housing 110' and a waterproof pin 130. The housing 110' has a first surface 111', a first side surface 112', and a second surface 113'. The first side surface 112' is recessed in the first surface 111' to define a first opening 114'. The side surface 112' is connected between the first surface 111' and the second surface 113', and the second surface 113' is exposed in the first opening 114'.

The first surface 111', the first side surface 112' and the second surface 113' may form a half-open groove for the waterproof pin 130 to be accommodated in the groove of the housing 110'. In addition, the second surface 113' may further have a second opening 115', the size (for example, diameter) of the second opening 115' is less than the size (for example, diameter) of the first opening 114', an electronic component (such as a reset key 136) located inside the housing 110 may be exposed from the second opening 115', as shown in FIG. 4. The waterproof pin 130 is detachably located above the position where the reset key 136 is disposed. When the waterproof pin 130 is removed, the user can press the reset key 136 to generate a reset signal. After the electronic component is reset, the waterproof pin 130 is reinstalled on the housing 110'.

In an embodiment, the waterproof pin 130 may be inserted into the first opening 114', and the waterproof pin 130 may include a rod 131, a water blocking structure 132, and a sleeve 133. The water blocking structure 132 may be pressed and deformed to block between the rod 131 and the housing 110' so as to improve the waterproof performance. In addition, the sleeve 133 may be disposed in the second opening 115' of the housing 110' so that the rod 131 can insert into the sleeve 133 and be fixed to the sleeve 133.

Referring to FIG. 4, the water blocking structure 132 is, for example, an annular body, and the pressed surface of the annular body has at least one rib 134 (the pressed part is shown by a dashed line). The rib 134 is formed as, for example, conical, pyramidal, zigzag, wavy or other shapes, and the inner surface, upper surface and lower surface of the annular body are provided with ribs 134, which can be pressed and deformed to abut against the side surface of the body 131, the bottom surface of flange of the rod 131, and the second surface 113' of the housing 110'. The material of the water blocking structure 132 is, for example, rubber or other soft materials, which can prevent moisture from flowing into the housing 110' through the gap between the rod 131 and the second surface 113' of the housing 110, thereby improving the waterproof performance.

In addition, referring to FIG. 4, the rod 131 has a boss 135, for example, which is located below the flange of the rod 131, and the rod 131 can be a screw or a pin with the boss 135, and the screw or the pin can be inserted into the sleeve 133 and fixed in the second opening 115' of the housing 110 via the sleeve 133, and the sleeve 133 (the pressed part is shown in dashed lines) tightly matches the size of the second opening 115'. In addition, the water blocking structure 132 surrounds the boss 135. When the rod 131 is inserted into the sleeve 133, the rib 134 of the water blocking structure 132 can be pressed and deformed to abut on the boss 135 and the second surface 113' to improve waterproof performance.

Of course, the present invention is not limited to use the sleeve 133 to fix the rod 131 in the second opening 115'. In another embodiment, the rod 131 is directly screwed in the second opening 115', for example.

In the embodiment, the boss 135 can prevent from the water blocking structure 132 being over-compressed by the rod 131 and causing the damage of the water blocking structure 132. As shown in FIG. 4, the boss 135 has, for example, a first height H1 in an axial direction of the rod 131, the water blocking structure 132 has a second height H2 relative to the boss 135, and the first height H1 is less than the second height H2.

The compression deformation of the water blocking structure 132 is the difference between the second height H2 and the first height H1. The difference is, for example, 5% to 10% of the second height H2, but it is not limited thereto. As long as the water blocking structure 132 is pressed under a suitable amount of deformation and can be restored to its original shape.

The waterproof structure of the above-mentioned embodiments of the present invention can be used in an electronic device, such as an antenna monitoring device, an antenna calibration device, or other functional electronic devices, which can prevent from the influence of weather such as moisture and humidity to improve the waterproof performance of the electronic device.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A waterproof structure, comprising:
a housing having a first surface, a first side surface, and a second surface, wherein the first side surface is recessed in the first surface to define a first opening, and the first side surface is connected between the first surface and the second surface, and the second surface is exposed from the first opening; and
a waterproof button, arranged in the first opening, the waterproof button comprising at least a first water blocking structure, and the first water blocking structure is pressed and deformed to abut against the first side surface,
wherein the waterproof button comprises an annular portion, a pressing portion, and a hard bridge, the pressing portion is located in a center of the annular portion, the first water blocking structure is disposed on an outer periphery of the annular portion, and the hard bridge is arranged under the pressing portion to support the pressing portion.

2. The waterproof structure according to claim 1, wherein the first water blocking structure is an annular rib.

3. The waterproof structure according to claim 1, wherein the annular portion and the pressing portion are made of rubber, and the hard bridge is made of plastic.

4. The waterproof structure according to claim 1, wherein the waterproof button further includes a second water blocking structure, and the second water blocking structure is formed between the annular portion and the second surface.

5. The waterproof structure according to claim 4, wherein the second water blocking structure is a waterproof adhesive.

6. The waterproof structure according to claim 4, wherein the second water blocking structure comprises a first adhesive layer, a flexible substrate, and a second adhesive layer, and the flexible substrate is located between the first adhesive layer and the second adhesive layer.

7. The waterproof structure according to claim 6, wherein the flexible substrate is a foam material.

8. A waterproof structure, comprising:
a housing having a first surface, a first side surface, and a second surface, wherein the first side surface is recessed in the first surface to define a first opening, the first side surface is connected between the first surface and the second surface, and the second surface is exposed from the first opening;
a waterproof pin, arranged in the first opening, the waterproof pin comprising a rod and a water blocking structure, the water blocking structure being pressed and deformed to block between the rod and the housing; and
a sleeve arranged in a second opening of the second surface, and the sleeve is used for the rod inserting into the second opening and fixing the rod In the second opening.

9. The waterproof structure according to claim 8, wherein the water blocking structure is an annular body, and a pressed surface of the annular body has at least one rib.

10. The waterproof structure according to claim 8, wherein the rod includes a boss, the water blocking structure surrounds the boss, and the water blocking structure is pressed and deformed to abut against the boss and the second surface.

11. The waterproof structure according to claim 10, wherein the rod is a screw with the boss.

12. The waterproof structure according to claim 10, wherein the boss has a first height, and the water blocking structure has a second height relative to the boss, and the first height is smaller than the second height.

13. The waterproof structure according to claim 12, wherein a compression deformation of the water blocking structure is a difference between the second height and the first height.

14. The waterproof structure according to claim 8, wherein a reset key is disposed in the housing, and the waterproof pin is detachably arranged above the reset key.

15. A waterproof structure, comprising:
a housing having a first surface, a first side surface, and a second surface, wherein the first side surface is recessed in the first surface to define a first opening, and the first side surface is connected between the first surface and the second surface, and the second surface is exposed from the first opening; and
a waterproof button, arranged in the first opening, the waterproof button comprising at least a first water blocking structure, and the first water blocking structure is pressed and deformed to abut against the first side surface,
wherein the waterproof button comprises an annular portion and a pressing portion, the pressing portion is located in a center of the annular portion, the first water blocking structure is disposed on an outer periphery of the annular portion, and
the waterproof button further comprises a second water blocking structure, and the second water blocking structure is formed between the annular portion and the second surface.

* * * * *